(12) United States Patent
Gan et al.

(10) Patent No.: US 8,912,653 B2
(45) Date of Patent: Dec. 16, 2014

(54) PLASMA TREATMENT ON SEMICONDUCTOR WAFERS

(75) Inventors: Kah Wee Gan, Singapore (SG);
Yonggang Jin, Singapore (SG);
Anandan Ramasamy, Singapore (SG);
Yun Liu, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 11 days.

(21) Appl. No.: 13/327,563

(22) Filed: Dec. 15, 2011

(65) Prior Publication Data
US 2012/0168938 A1 Jul. 5, 2012

Related U.S. Application Data

(63) Continuation-in-part of application No. 12/982,719, filed on Dec. 30, 2010, now abandoned.

(51) Int. Cl.
*H01L 23/52* (2006.01)
*H01L 21/3105* (2006.01)
*H01L 21/56* (2006.01)
*H01L 23/00* (2006.01)
*H01L 21/311* (2006.01)
*H01L 23/31* (2006.01)

(52) U.S. Cl.
CPC .......... *H01L 21/3105* (2013.01); *H01L 21/561* (2013.01); *H01L 24/19* (2013.01); *H01L 2224/12105* (2013.01); *H01L 21/31116* (2013.01); *H01L 23/3128* (2013.01); *H01L 21/568* (2013.01); *H01L 24/96* (2013.01)
USPC ................... 257/739; 257/734; 257/E21.012; 257/E29.106; 257/E33.074; 257/E31.13; 438/71; 438/665

(58) Field of Classification Search
None
See application file for complete search history.

(56) References Cited

U.S. PATENT DOCUMENTS

| | | | |
|---|---|---|---|
| 5,391,397 A | 2/1995 | Mukerji | |
| 7,864,542 B2 | 1/2011 | Inagaki et al. | |
| 2002/0052113 A1 | 5/2002 | Khan et al. | |
| 2005/0170633 A1* | 8/2005 | Sasaki et al. | 438/622 |
| 2006/0220220 A1 | 10/2006 | Nakagawa et al. | |
| 2007/0019101 A1 | 1/2007 | Minamio et al. | |
| 2009/0014894 A1* | 1/2009 | Ishida et al. | 257/777 |
| 2009/0053459 A1* | 2/2009 | Hirose et al. | 428/76 |
| 2009/0160071 A1* | 6/2009 | Shen | 257/786 |
| 2009/0263939 A1* | 10/2009 | Sakamoto et al. | 438/126 |
| 2010/0078830 A1* | 4/2010 | Katsurayama et al. | 257/777 |

* cited by examiner

*Primary Examiner* — Su Kim
(74) *Attorney, Agent, or Firm* — Seed IP Law Group PLLC

(57) ABSTRACT

A semiconductor wafer has integrated circuits formed thereon and a top passivation layer applied. The passivation layer is patterned and selectively etched to expose contact pads on each semiconductor die. The wafer is exposed to ionized gas causing the upper surface of passivation layer to roughen and to slightly roughen the upper surface of the contact pads. The wafer is cut to form a plurality of semiconductor dies each with a roughened passivation layer. The plurality of semiconductor dies are placed on an adhesive layer and a reconstituted wafer formed. Redistribution layers are formed to complete the semiconductor package having electrical contacts for establishing electrical connections external to the semiconductor package, after which the wafer is singulated to separate the dice.

13 Claims, 12 Drawing Sheets

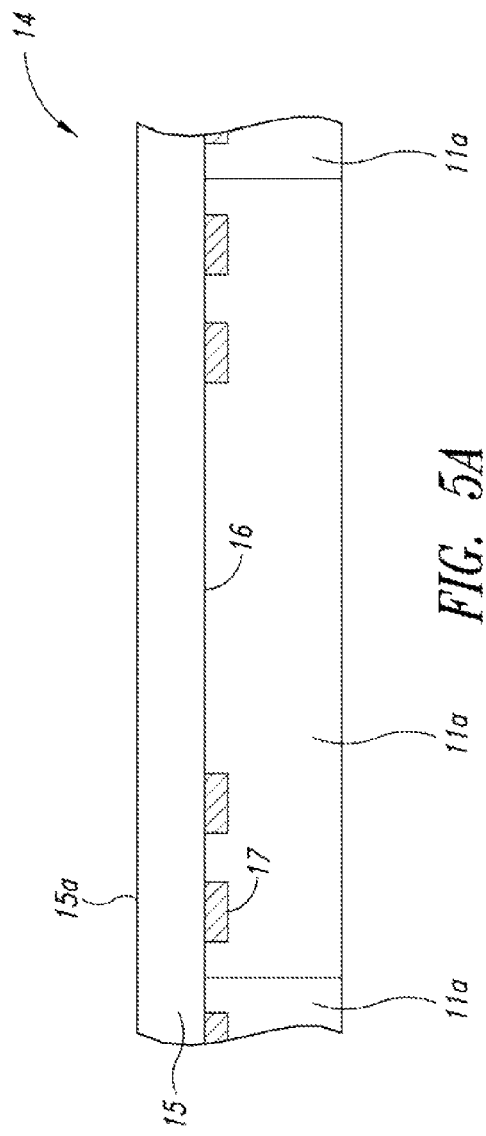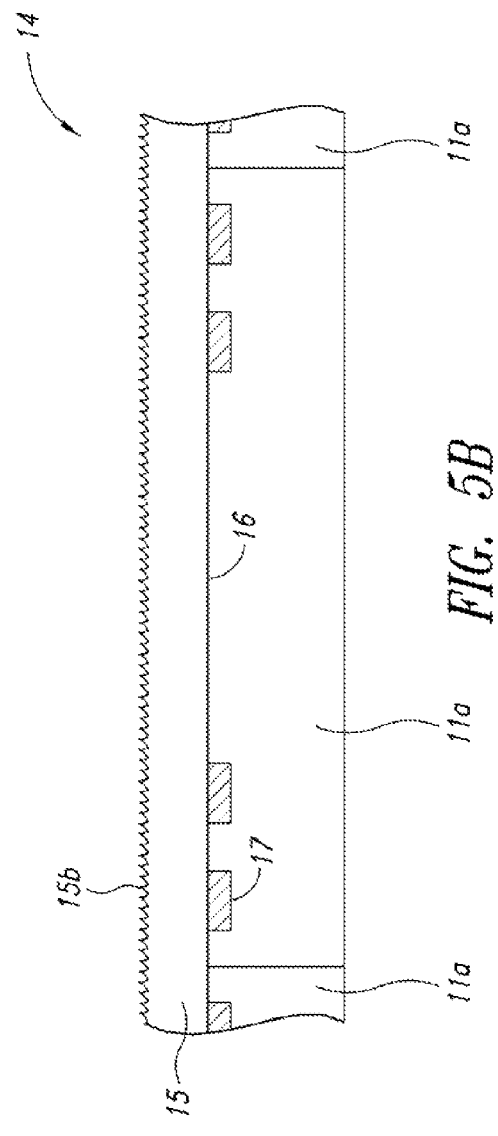

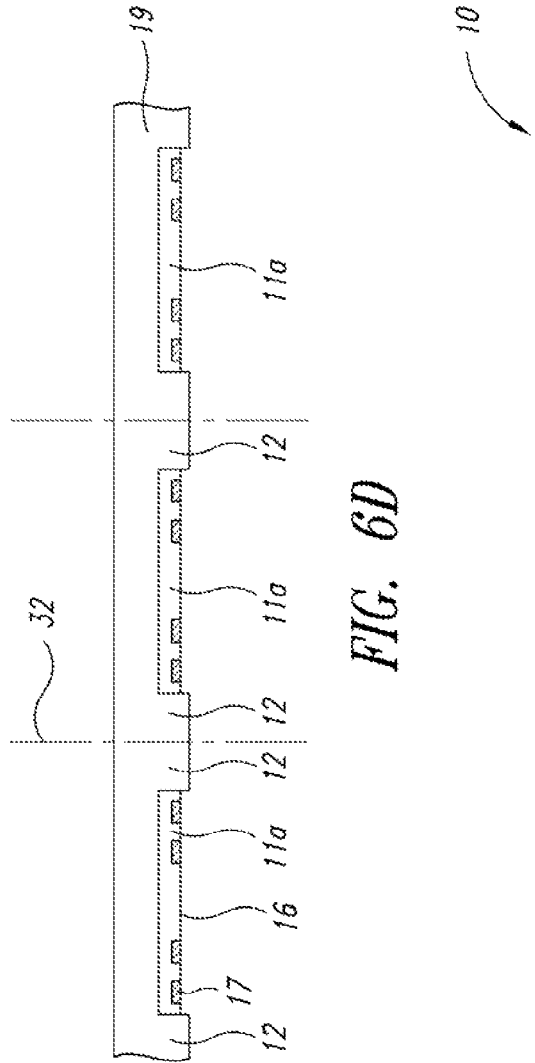
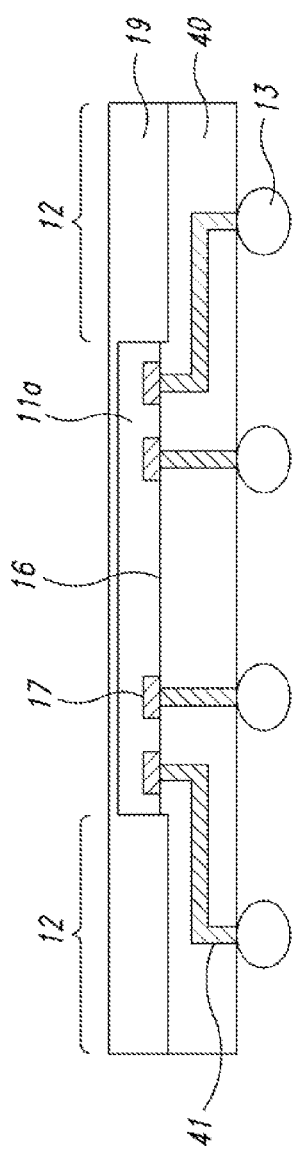

PLASMA TREATMENT ON SEMICONDUCTOR WAFERS

BACKGROUND

1. Technical Field

This description generally relates to a reconstituted semiconductor wafer with semiconductor chips embedded within that have been treated in a plasma chamber.

2. Description of the Related Art

Typically, after a semiconductor chip is manufactured, it must further be processed and encapsulated in a package that functions to protect the chip and to establish electrical connections from the chip to the external environment. Two methods by which a semiconductor chip may be packaged include fan-in and fan-out packages.

Fan-in methods of semiconductor packaging usually result in a semiconductor package that is essentially the same size as the semiconductor chip. This is because fan-in methods use wafer level packaging techniques that build the semiconductor package on top of the semiconductor wafer after the chips have been created. Due to the proximity of each semiconductor chip to one another on the wafer there is limited space for making electrical connections laterally, so packages are built vertically. As a result, and because of the chip size, a limited amount of space is available for electrical contacts.

Fan-out methods of semiconductor packaging are not restricted by the size of the semiconductor chip in determining the number of electrical contacts to the external environment. This is because fan-out semiconductor packages have a larger footprint area than that of the semiconductor chips within. Typically, during fan-out methods of semiconductor packaging, the semiconductor chips are cut from the semiconductor wafer after the chips are manufactured. The cut chips are subsequently placed on an adhesive layer and formed into a reconstituted wafer. Since the semiconductor chips were not formed on the reconstituted wafer initially, they must be either permanently or temporarily affixed to the surface to form the reconstituted wafer.

Several known ways of adhering chips to a surface include adhesive glue, adhesive tape, epoxy resin, etc. Even with known methods of affixing chips to a reconstituted wafer, however, there is a possibility that the chips will move due to various stresses and forces during the packaging process. For example, the upper surface of the semiconductor wafer is usually a passivation layer that may be made of various different types of materials. Each type of passivation layer may be designed to adhere to different types of adhesive layers during semiconductor chip packaging. As a result, when the chip packaging reaches an encapsulation process, chips that are not well adhered may be knocked loose, resulting in what is known as flying dies (i.e., flying chips). Flying dies are undesirable because the number of viable semiconductor packages produced is reduced and the cost of manufacturing semiconductor packages is increased.

BRIEF SUMMARY

A method of manufacturing a semiconductor package is disclosed. A semiconductor wafer with a passivation layer is formed. The wafer has a plurality of semiconductor chips formed thereon. The passivation layer is exposed to ionized gas, which causes a surface of the passivation layer to roughen. After the passivation layer is exposed to ionized gas and the semiconductor wafer is cut into a plurality of semiconductor chips, at least one of the plurality of semiconductor chips is placed on an adhesion layer with the passivation layer of the chip making contact with the adhesion layer.

According to one embodiment, the passivation layer is patterned and etched to expose the contact pads of the semiconductor chip prior to exposing the passivation layer to the ionized gas. This has the benefit of not requiring the etching back of the passivation layer and permits the application of the redistribution layer directly to the roughened passivation layer after the adhesion layer has been removed. It also provides the benefit that the surface of the contact pads may be slightly roughened, though not as roughen as the passivation layer, which provides some increased contact area for the solder and improves electrical conductivity because of the increased surface area between the contact pad and the solder of the redistribution layer.

A semiconductor package with a semiconductor chip is also disclosed. The semiconductor chip is formed within the semiconductor package. The semiconductor chip has a passivation layer formed on one side of the chip. The passivation layer is subjected to ionized gas before the semiconductor package is formed. An encapsulation layer encloses the semiconductor chip except on the passivation layer side. The passivation layer has a roughened surface as a result of being exposed to the ionized gas.

An integrated chip packaging system for manufacturing semiconductor packages is also disclosed. The integrated chip packaging system includes a cutting device for cutting a semiconductor wafer into a plurality of semiconductor chips. The integrated chip packaging system also includes an ionization chamber for exposing a passivation surface of the semiconductor wafer to ionized gas. An affixing device is included in the integrated chip packaging system and is configured to affix at least one of the plurality of semiconductor chips to an adhesion layer of a reconstituted wafer. The semiconductor chips on the reconstituted wafer are encapsulated and formed into individual semiconductor packages.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIG. 5A is a side view of a semiconductor wafer before processing in the plasma etching chamber according to one embodiment.

FIG. 5B is a side view of the semiconductor wafer of FIG. 5A after processing in the plasma etching chamber according to one embodiment.

FIG. 6D is a side view of a next step in forming the reconstituted semiconductor wafer with the passivation layer and portions of the encapsulation layer removed according to one embodiment.

FIG. 7 is a side view of a semiconductor package formed from an encapsulated chip cut from the reconstituted wafer previously formed in FIGS. 6A-6D according to one embodiment.

DETAILED DESCRIPTION

Figure 1:
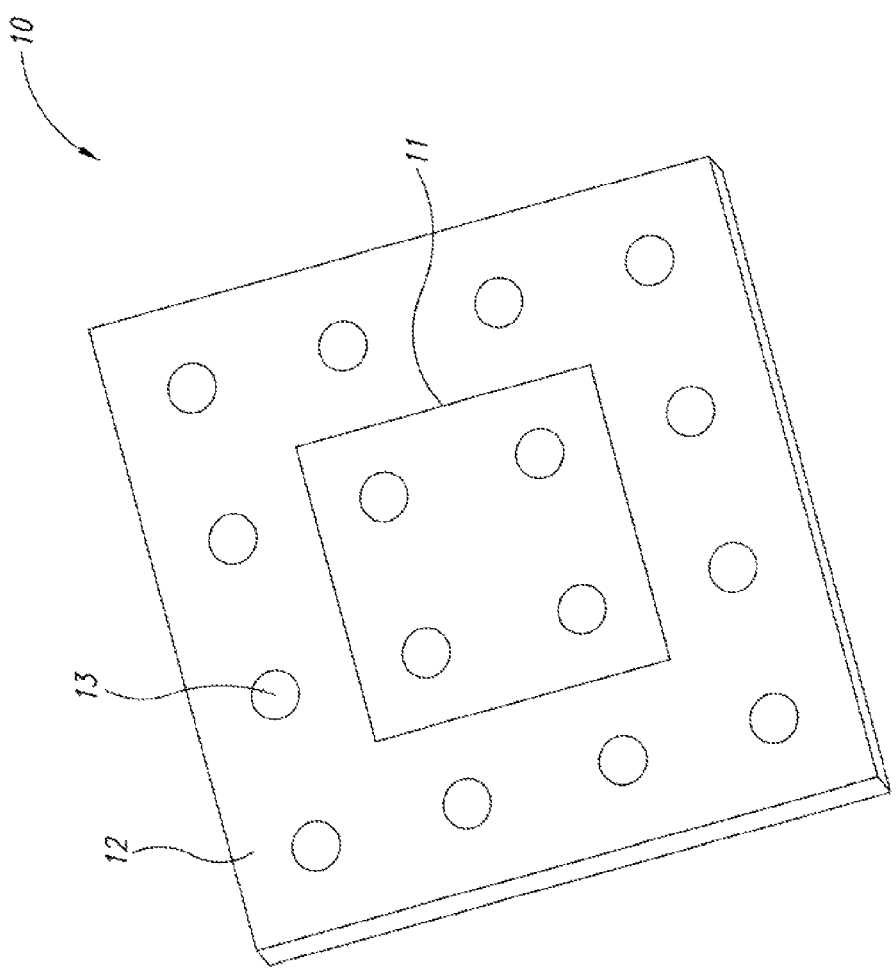
FIG. 1 is an isometric view of a semiconductor package according to one embodiment of the present disclosure.

In the following description, certain specific details are set forth in order to provide a thorough understanding of various aspects of the disclosure. However, one skilled in the art will understand that the disclosure may be practiced without these specific details. In some instances, well-known structures and methods of forming the structures associated with the semiconductor package have not been described in detail to avoid obscuring the descriptions of the aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one aspect" or "an aspect" means that a particular feature, structure, or characteristic described in connection with the aspect is included in at least one aspect. Thus, the appearances of the phrases "in one aspect" or "in an aspect" in various places throughout this specification are not necessarily all referring to the same aspect. Furthermore, the particular features, structures, or characteristics may be combined in any suitable manner in one or more aspects of the present disclosure.

In the drawings, identical reference numbers identify similar features or elements. The size and relative positions of features in the drawings are not necessarily drawn to scale.

FIG. 1 shows a semiconductor package 10 according to one embodiment of the present disclosure. The semiconductor package 10 has a semiconductor chip area 11, a fan-out layer area 12, and electrical contacts 13 formed on both the semiconductor chip area 11 and the fan-out layer area 12. The semiconductor chip area 11 and fan-out area 12 identify where in the semiconductor package 10 the chip is located. The semiconductor package 10 may also have other elements included therein. These additional elements may be passive elements such as resistors, capacitors, and inductors, connective substrates, and other connective elements, such as bonding wires or the like.

The electrical contacts 13 may be conductive metal, such as solder balls, used to connect the semiconductor package 10 to another device, including a printed circuit board (not shown). The electrical contacts 13 are preferably attached to the semiconductor package 10 using a solder reflow paste or other temporary adhesive. The semiconductor package 10 is subsequently affixed to another device using a solder reflow process in which the electrical contacts 13 melt and attach to other electrical contacts (not shown) attached on the other device.

Figure 2:
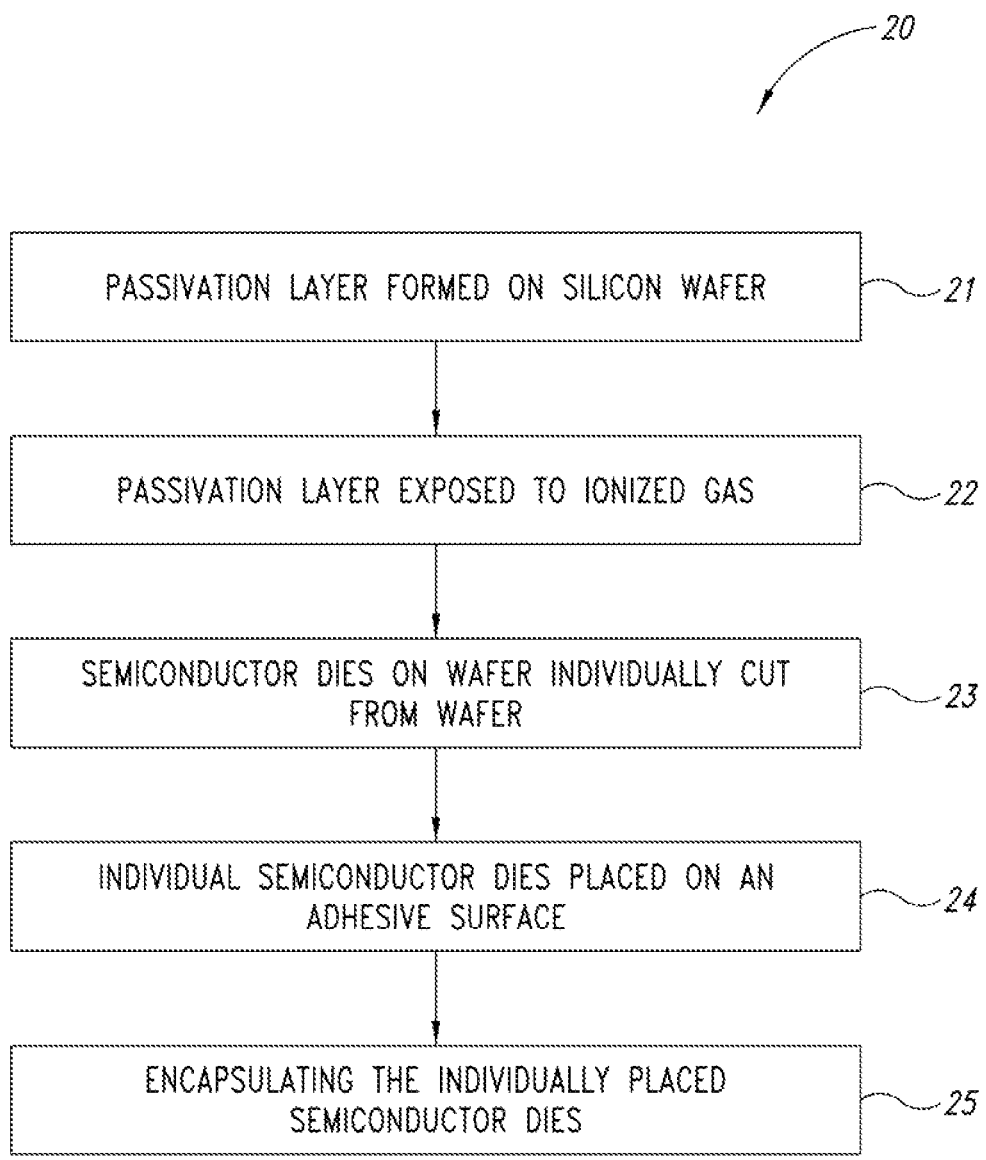
FIG. 2 is a flowchart of a process according to one embodiment of the present disclosure for creating a reconstituted wafer that has a plurality of packaged semiconductor chips.

The semiconductor package 10 is typically formed from a reconstituted wafer having many semiconductor packages manufactured in a batch processing environment. During manufacturing, the various layers and components of the semiconductor package 10 are formed on many semiconductor areas at once to improve throughput and lower the cost of manufactured semiconductor packages. FIG. 2 shows a process flow 20 for forming a reconstituted wafer that has a plurality of semiconductor chips placed thereon.

Figure 3:
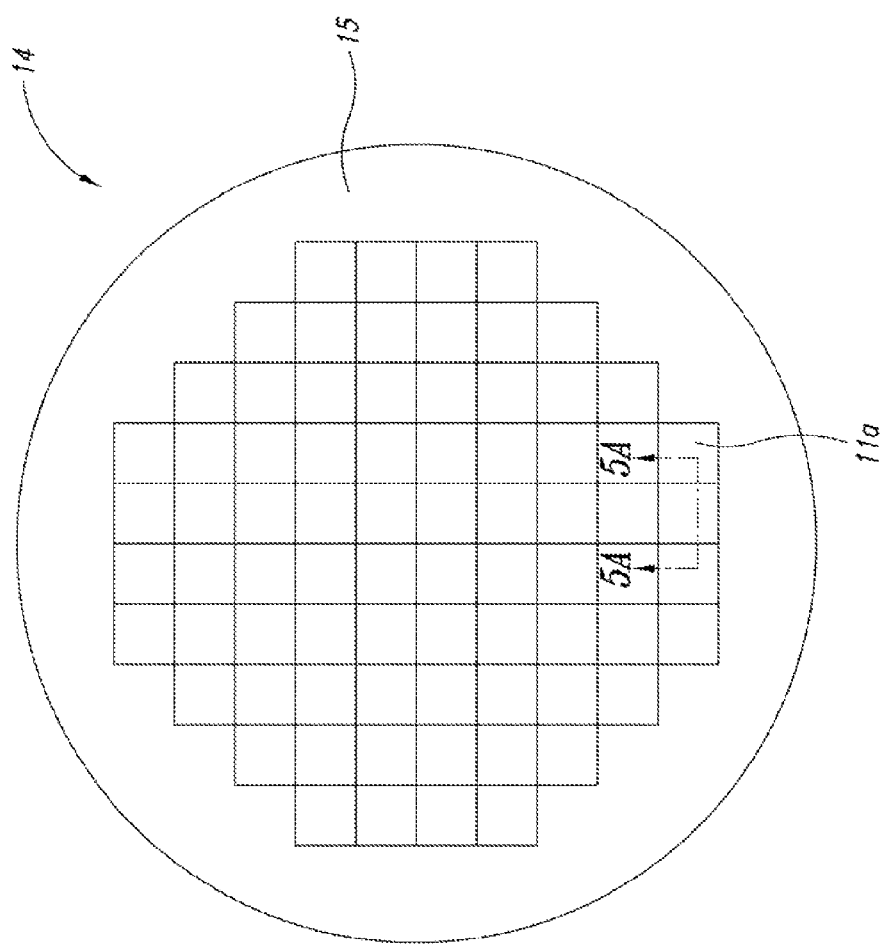
FIG. 3 is a top view of a semiconductor wafer having semiconductor chips formed thereon according to one embodiment.

Beginning at step 21 of the process flow 20 shown in FIG. 2, a passivation layer is formed on a silicon wafer having semiconductor chips. For example, FIG. 3 shows a semiconductor wafer 14 with individual semiconductor chips 11a that have a passivation layer 15 formed on the semiconductor wafer 14. The passivation layer 15 may be formed of an insulating material, such as silicon nitride ($Si_3N_4$), silicon dioxide ($SiO_2$), an oxynitride compound, either as single layers or layers overlaid on top of each other. Further, the passivation layer 15 may be formed using plasma-enhanced chemical vapor deposition, low-pressure chemical vapor deposition, or the like.

Moving to step 22 of the process flow 20, the passivation layer 15 is exposed to ionized gas, which results in a roughened passivation layer.

Figure 4:
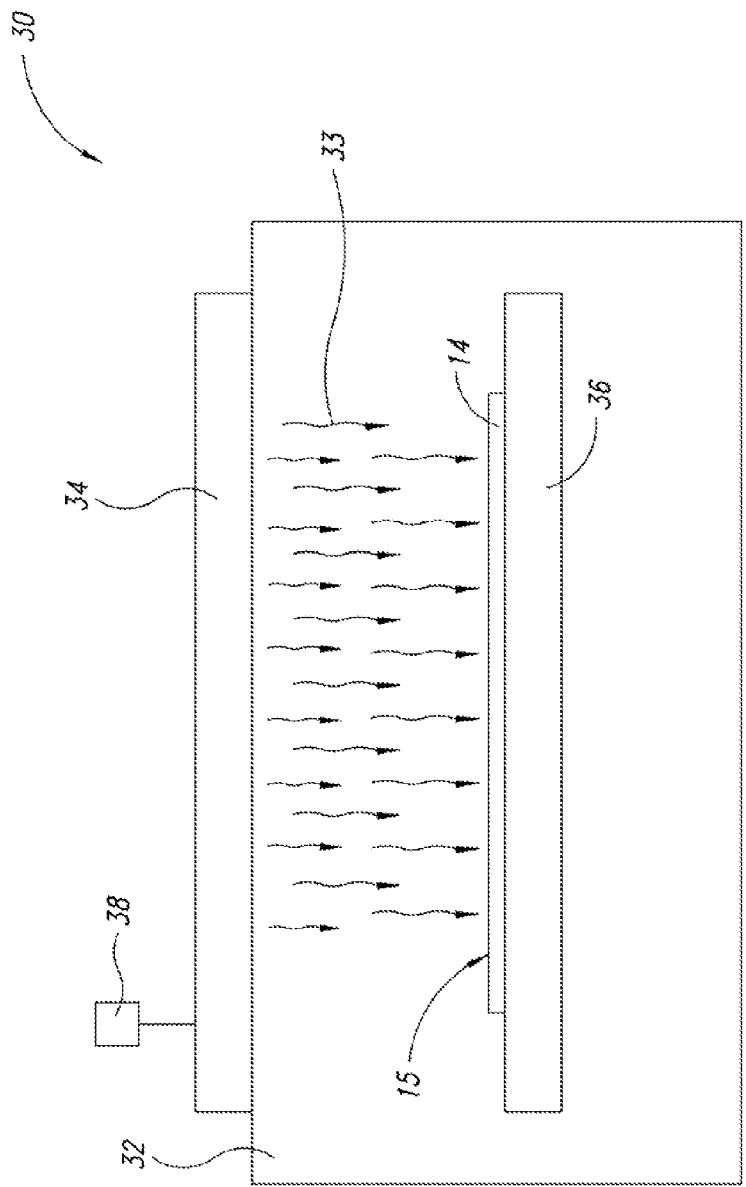
FIG. 4 is a side view of a plasma etching chamber used to etch a passivation layer formed on a semiconductor wafer according to one embodiment.

FIG. 4 shows a plasma etching chamber 30 according to one embodiment. The plasma etching chamber 30 has a chamber 32 for receiving and holding the semiconductor wafer 14 on a wafer chuck 36. The semiconductor wafer 14 may be held in place by the wafer chuck 36 to remain stable during the plasma etching process. The plasma etching chamber 30 also has an upper portion 34 and a power source 38. According to one aspect of the present embodiment, the upper portion 34 is located outside the chamber 32. Alternatively, the upper portion 34 may be located inside the chamber 32 depending on the type of plasma etching carried out in the plasma etching chamber 30. The power source 38 may be attached to both the wafer chuck 36 and the upper portion 34.

The plasma etching chamber 30 exposes the passivation layer 15 to ionized gas, which interacts with the passivation layer 15 material causing a roughened surface to develop. According to one embodiment, the passivation layer 15 is etched using reactive-ion etching ("RIE"). When the plasma etching chamber 30 uses RIE, the chamber 32 is filled with a gas at low pressure. For example, the gas may be carbon tetrafluoride ($CF_4$, also known as tetrafluoromethane) or oxygen ($O_2$). When the power supply 38 is activated, a voltage is applied across the wafer chuck 36 and the upper portion 34. To form the voltage potential, the upper portion 34 may be connected to ground or is negatively charged, whereas the wafer chuck 36 is positively charged.

When the voltage is applied across the upper portion 34 and the wafer chuck 36, an electric field is produced inside the chamber 32 that causes the gas inside the chamber 32 to ionize, or become a plasma. In the case where $CF_4$ is used as the gas, negatively charged ions 33 (fluorine, $F^-$ in this case) are produced within the electric field and accelerated from the upper portion 34 to the wafer chuck 36. The negatively charged ions 33 accelerate toward the wafer chuck 36 and bombard the passivation layer 15 of the semiconductor wafer 14, which causes an upper surface of the passivation layer 15 to roughen. Instead of using $CF_4$ gas, $O_2$ gas or other gases that produce negative ion particles in an electric field may be used in the plasma etching chamber 32.

In an alternative embodiment, the passivation layer 15 is etched using inductive coupled plasma etching ("ICP"). In ICP etching, the upper portion 34 of the plasma etching chamber 30 includes an inductive coil (not shown) connected to the power source 38 and a top plate (not shown), such as a quartz window, which permits an induced electric field to enter the chamber 32 while protecting the chamber 32 from possible stray ions emitted from the inductive coil during operation. The inductive coil used in ICP may be a flat coil (planar) wrapping in on itself within a plane or a helix coil laterally wrapping around an axis. The wafer chuck 36 is not connected to the power source 38 using ICP plasma etching. As a result, the power source 38 supplies a voltage across the inductive coil inside the upper portion 34, which causes an induced electric field to enter the chamber 32 below the upper portion 34.

In the ICP technique, the chamber 32 is filled with a gas, such as $CF_4$ or $O_2$, which ionizes in the presence of the electric field generated by the inductive coil inside the upper portion 34, similar to the ionized gas in the RIE technique. Although the wafer chuck 36 is not connected to the power source 38 in the ICP technique, it may be connected to a matching power source (not shown) to positively charge the wafer chuck 36. Once the wafer chuck 36 is positively charged, the negative ions 33 produced in the plasma in the chamber 32 are accelerated toward the wafer 14. The negatively charged ions 33 bombard the passivation layer 15 and cause an upper surface of the passivation layer 15 to roughen.

Using both the RIE and ICP techniques does not completely etch away the passivation layer 15. Rather, only an upper surface of the passivation layer 15 is etched and roughened. Additionally, any plasma etching technique in which the upper layer of the passivation layer 15 is roughened is considered an equivalent to the RIE and ICP techniques.

Because the contact pads 17 are not exposed, an etch chemistry having a gas mixture or chemistry that would otherwise damage the metal on pads 17 can be used if desired.

FIG. 5A shows an enlarged side view of the semiconductor chip 11a before the plasma etching process described with regard to FIG. 4. FIG. 5B shows an enlarged view of the semiconductor chip 11a after the plasma etching process described with regard to FIG. 4. In both FIGS. 5A and 5B, the semiconductor chip 11a has an active side 16 and contact pads 17. The contact pads 17 are locations where electrical connections to the external circuits can be made. The passivation layer 15 has an upper smooth surface 15a that is substantially smooth and flat as shown in FIG. 5A before the plasma etching process. After the plasma etching process, the passivation layer 15 becomes roughened and has an upper roughened surface 15b as shown in FIG. 5B. The actual roughness of the upper roughened surface 15b may not be as uniform as or shaped like the upper roughened surface 15b as illustrated in FIG. 5B. The jagged surface shown in FIG. 5B of upper roughened surface 15b is for illustrative purposes only and should not be interpreted to limit the scope of the present disclosure or claims to the particular pattern or roughness shown.

Figure 6A:
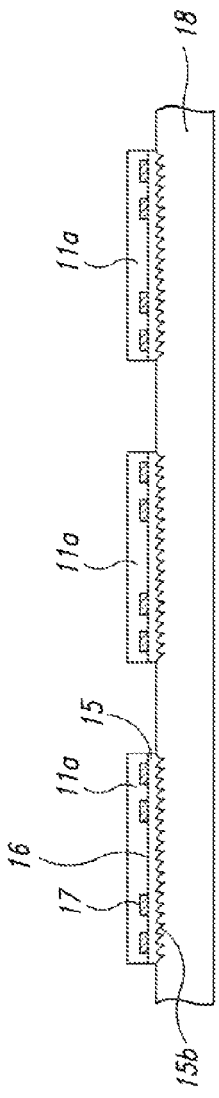
FIG. 6A is a side view of a first step in forming a reconstituted wafer using individually cut chips from the semiconductor wafer that has been processed in the plasma etching chamber shown in FIG. 4 according to one embodiment.

After the passivation layer 15 has been roughened by the etch, the semiconductor wafer 14 is cut using a saw (not shown) to form individual semiconductor chips 11a as indicated in step 23 of FIG. 2. The semiconductor wafer 14 may be cut using any known techniques or their equivalents. After the semiconductor wafer 14 is cut, the individual semiconductor chips 11a are placed on an adhesive surface as indicated in step 24 of FIG. 2 and shown in FIG. 6A. The individually cut semiconductor chips 11a are flipped and placed with the upper roughened surface 15b making contact with an adhesive layer 18.

According to one embodiment, the adhesive layer 18 is a reconstitution tape or another type of adhesive tape used for securing semiconductor and other electrical components temporarily. In an alternative embodiment, the adhesive layer 18 may comprise a non-adhesive solid layer (not shown) covered by a layer of adhesive (not shown), such as adhesive glue on top of a solid metal or ceramic layer. The semiconductor chip 11a would similarly be placed with the upper roughened surface 15b of the passivation layer 15 in direct contact with the adhesive glue.

Figure 6B:
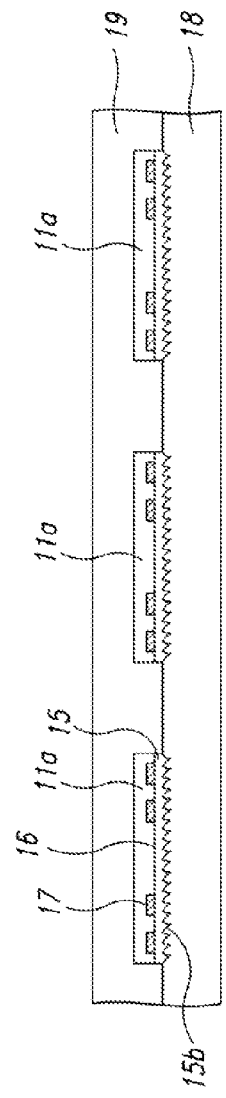
FIG. 6B is a side view of a next step in forming the reconstituted semiconductor wafer by forming an encapsulation layer over the individually cut semiconductor chips according to one embodiment.

After the individual semiconductor chips 11a are placed on the adhesive layer 18, an encapsulation layer 19 is formed, enclosing the semiconductor chips 11a, as indicated in step 25 and shown in FIG. 6B. In one embodiment, the encapsulation layer 19 is a molding layer made of a molding material such as a composite that may include an epoxy resin, a hardener, a catalyst, or the like. The encapsulation layer 19 is further made of a material that is flexible yet tolerant to mechanical stresses.

The encapsulation layer 19 may be formed by injecting a liquid encapsulation material onto the top of the adhesive layer 18 and semiconductor chips 11a. In the prior art, if the semiconductor chips 11a were not secure because the adhesion is not strong enough, for example because the die was not completely flush with the adhesive, the die was not planar with the adhesive, the adhesive had some prior debris thereon, or the like, the force from the injected encapsulation material might have pushed the semiconductor chips 11a out of place, causing the die to move from the location in which it was placed. As a result, in the prior art, the moved semiconductor chip 11a cannot be used in the final package. Worse yet, if the dislodged die has landed in an area with another semiconductor chip, neither area can be used to create a working semiconductor package. Accordingly, enhancing the adhesive properties of the semiconductor chips 11a by plasma etching the passivation layer 15 to create the upper roughened surface 15b reduces dislodging of dies from the adhesive layer 18 and increases semiconductor package throughput.

Figure 6C:
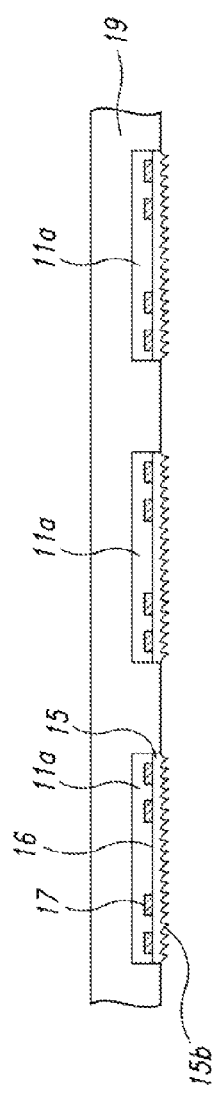
FIG. 6C is a side view of a next step in forming the reconstituted semiconductor wafer by removing the adhesive layer according to one embodiment.

Once the encapsulation layer 19 is formed, as seen in FIG. 6B, the adhesive layer 18 is removed, as seen in FIG. 6C. In one embodiment, the adhesive layer 18 may be removed physically, such as by pulling the adhesive layer 18 away from the encapsulation layer 19 and the semiconductor chips 11a. In an alternative embodiment, the adhesive layer 18 is heated to a temperature at which point adhesive properties of the adhesive layer 18 are lost and the adhesive layer 18 may fall off. Any other known way of removing the adhesive layer 18 is acceptable, such as grinding the adhesive layer 18 away, etc.

As seen in FIG. 6D, once the passivation layer 18 is removed, the active side 16 of the semiconductor chip 11a is exposed. In one embodiment, the passivation layer 15 is etched with a blanket etch, such as chemical mechanical polishing/planarization ("CMP") or the like. Grinding or polishing down the passivation layer 15 also may remove a portion of the encapsulation layer 19, but it is not necessary to make the encapsulation layer 19 flush with the active side 16 of the semiconductor chip 11a.

Layer 15 may also be etched with a reactive ion etch that is done without a mask and is selective to remove the passivation layer 15 but not remove the contact pads 17 nor the uppermost dielectric layers of the chip 11a.

In an alternative embodiment, the passivation layer 15 is removed using a chemical or plasma etching process. For example, dry plasma etching or wet chemical etching may be used to remove the passivation layer 15 and expose the active side 16 of the semiconductor chip 11a. If an etching process is used to remove the passivation layer 15, the encapsulation layer 19 may not be flush with the active side 16 of the semiconductor chip 11a. By doing this, the active side 16 of the semiconductor chip 11a may still be accessed and further processed as described with regard to FIG. 7.

In an additional embodiment, the encapsulation layer 19 may be ground down from the side of the semiconductor chip 11a opposite the active side 16. That is, the encapsulation layer 19 may be ground down to reduce the size of the semiconductor package 10. The encapsulation layer 19 may be ground down using CMP or the like.

FIG. 6D also shows locations 32 where the reconstituted wafer will later be cut to singulate the die. Once the reconstituted wafer has been formed as shown in FIG. 6D, a redistribution layer 40 is formed thereon to provide electrical contact to the individual semiconductor packages before being cut from the reconstituted wafer at the singulation location 32. After the reconstituted wafer is cut at the singulation location 32, the semiconductor chips may be processed further and formed into the semiconductor package 10 as seen in FIGS. 1 and 7.

FIG. 7 shows a side view of the semiconductor package 10 with a semiconductor chip 11a that was formed using the process as shown and described with regard to FIGS. 6A-6D. The semiconductor chip 11a is enclosed by the encapsulation layer 19 and a redistribution layer 40. According to one embodiment, a top layer (not shown) of the encapsulation layer 19 may be a heat sink that dissipates heat from the semiconductor chip 11a to the external environment of the semiconductor package 10. Additionally, the redistribution layer 40 may be formed of an insulating substrate, such as silicon dioxide, epoxy resin, polyimide or the like, that electrically insulates the semiconductor chip 11a and provides rigidity for the semiconductor package 10.

FIG. 7 also shows electrical contacts 13 attached to the redistribution layer 40. The electrical contacts 13 may be solder balls or other electrically connecting material. To connect the semiconductor chip 11a to the external environment, the bottom layer 40 has electrical traces 43 embedded within to connect the semiconductor chip 11a to the electrical contacts 13. The embedded electrical traces 43 may be formed of various metals, such as copper, gold, titanium, etc.

According to one alternative embodiment of FIG. 6D, only an upper part of passivation layer 15 is removed in the blanket etch. The passivation layer 15 is composed a series of layers on top of each other, such as a silicon dioxide having an oxynitride and then a silicon nitride overlaid thereon. In one embodiment, just the top most layer, in this embodiment, the silicon nitride, is removed by polishing, etching, chemical mechanical polishing/planarization ("CMP") or the like. Removing only the top layer of the passivation layer 15 leaves the main part of the passivation layer intact to continue to protect the electrical circuits and various layers in the semiconductor die 11a. After this etching, then the remaining passivation layer is patterned and etched to selectively expose the contact pads 17. This series of steps, rather then performing a blanket etch or CMP to fully remove layer 15 to expose the contact pads 17 does so using a photoresist and mask process of a type well known in the art. This provides exposure of the upper surface of the contact pads 17 without subjecting them to the blanket etch used to remove the entire passivation layer 15.

In a further alternative embodiment, the passivation layer 15 is not blanket etched at all. Rather, after the adhesive layer 18 is removed, the passivation layer 15 is patterned and then selectively etched to form apertures over the contact pads 17 to expose them. After the contact pads 17 are exposed, then a redistribution layer is formed over the top of the passivation layer 15, in contact with the upper most roughened surface 15b. The redistribution layers are dielectric layers of a type well known in the art. For example, they might be a polyimide, a epoxy resin, a fiberglass type layer or any of the many acceptable combinations of dielectric layers used for this purpose in the art today as is well known to those who work in this art. After this redistribution layer is formed, then the appropriate electrical connections are formed to the contact pads 17, using any of the well know acceptable connection techniques, such as solder paste, solder balls, copper pillars and the like. Alternating layers of redistribution layers and electrical traces are formed to complete the full packing and redistribution layer 40 as shown in FIG. 7.

The redistribution layer 40 is formed and the above steps carried out on the wafer 14 as a whole, while all the die 11a are part of wafer 14. After the redistribution layer 40 is fully formed, then the individual die are singulated into the final package as shown in FIG. 7.

Various embodiments have been described for carrying out aspects of the present invention. An alternative embodiment which is also beneficial for practicing the present invention will now be described. Many of the steps in the alternative embodiment are interchangeable with the steps of the prior embodiment, as will be clear from the description to one of skill in the art, to which this invention pertains.

Figure 8:
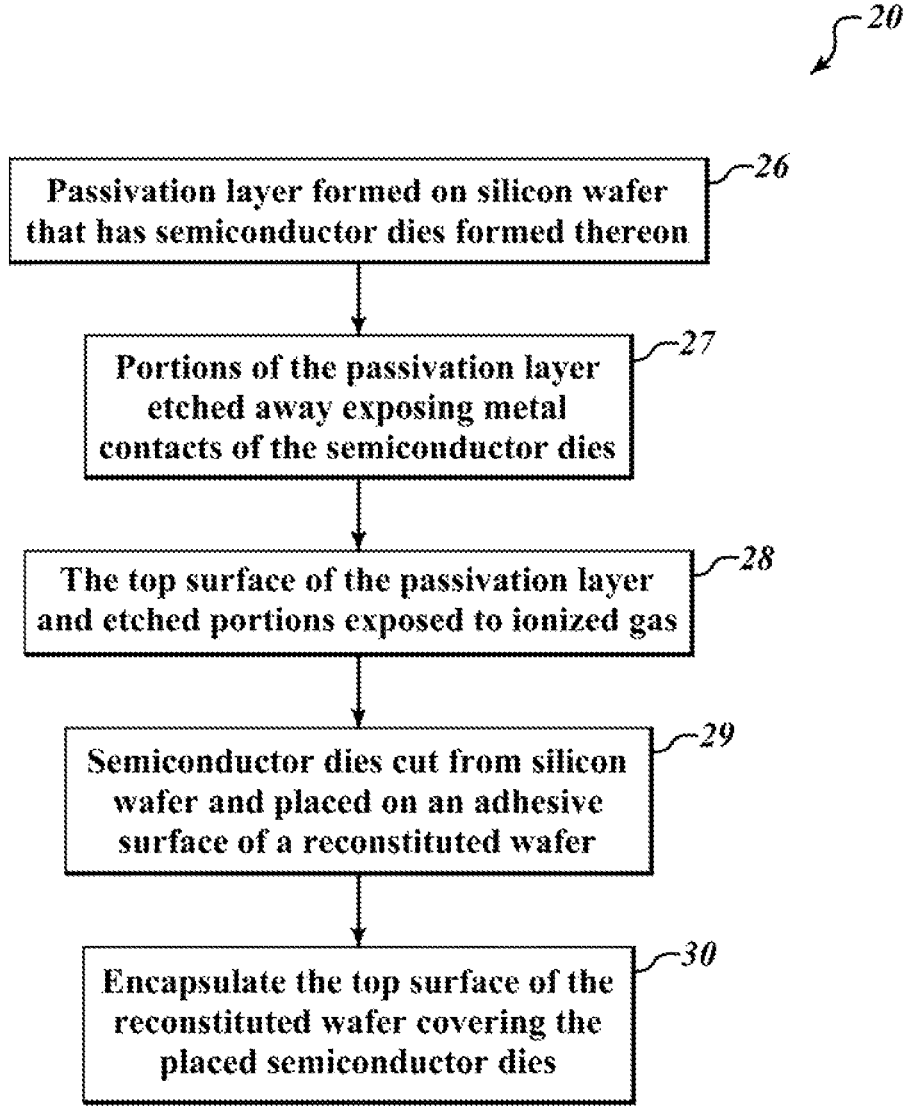
FIG. 8 is a flowchart of the process according to a second embodiment of the present disclosure.
Figure 9:
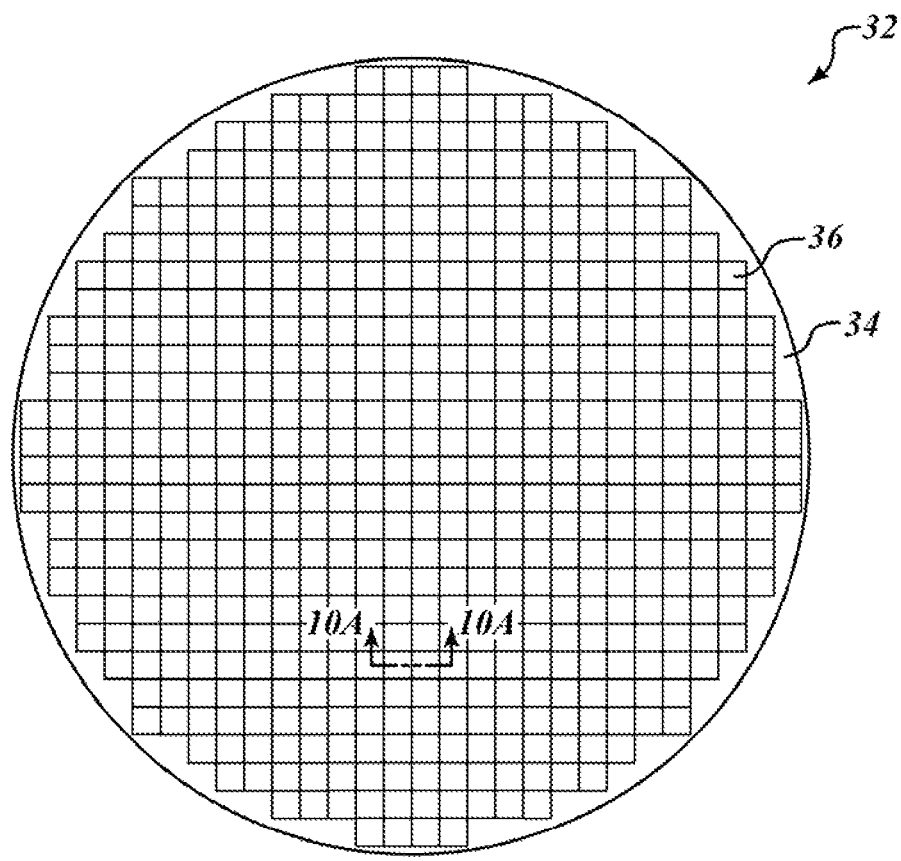
FIG. 9 is a top side view of a semiconductor wafer according to an additional embodiment.

FIG. 8 illustrates a process flow 20 for carrying out the present invention according to one of the alternative embodiments. In step 26, as the silicon wafer is completely finished, one or more passivation layers are formed on the upper active surface of the semiconductor wafer. The passivation layer may be a silicon dioxide, silicon nitride, silicon carbide, or various combinations thereof. As is known in the art, the semiconductor dies each include a plurality of contact pads to permit electrical connection to be made between the other circuits in the semiconductor dies. The passivation layer, or layers, if multiple sublayers are used, are patterned and etched to expose the contact pads on the individual semiconductor dies. This provides a plurality of openings through the passivation layer to expose the metal contact pads. With the metal contact pads exposed, the wafer advances to the next step in 28 and the passivation layer, with the open contact pads, the wafer is exposed to the ionized gas as previously described herein with respect to FIG. 4 and step 22 of FIG. 2. Subsequently, as illustrated in step 29, the semiconductor wafer is singulated into a plurality of semiconductor dies and, using a pick-and-place machine, the individual dies are placed on an adhesive surface as the next step in making a reconstituted wafer and packaging. Next, in step 30, a molding compound is formed over the top surface of the reconstituted wafer covering the semiconductor dies, the adhesive layer is removed and one or more redistribution layers are formed to complete the packaging of the individual semiconductor dies. The wafer is then cut to singulate the individual packages FIG. 9 illustrates a semiconductor wafer 32 having a silicon substrate 34 and individual semiconductor chips 36 formed thereon, the chips sometimes being referred to individually as semiconductor die 36. In the embodiment of FIG.

9, a passivation layer has been formed thereon as can be seen in the next set of figures, 10A-10C, taken along lines 10A-10A of FIG. 9.

Figure 10A:
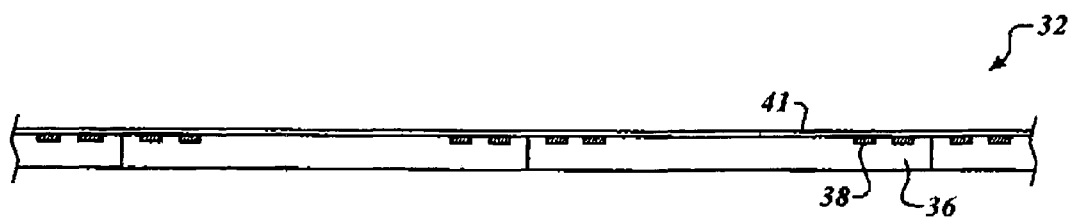
FIGS. 10A-10C are side views taken along the line 10A-10A of FIG. 9.
Figure 10B:
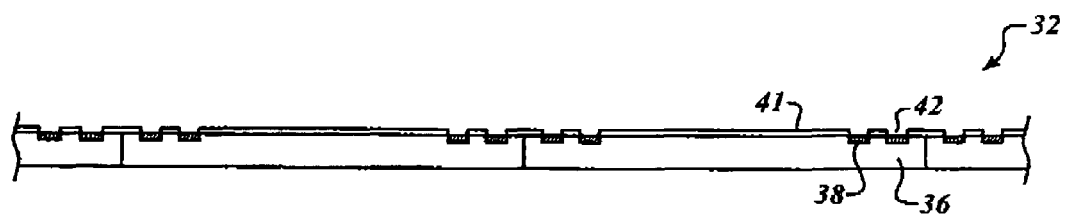
Figure 10C:
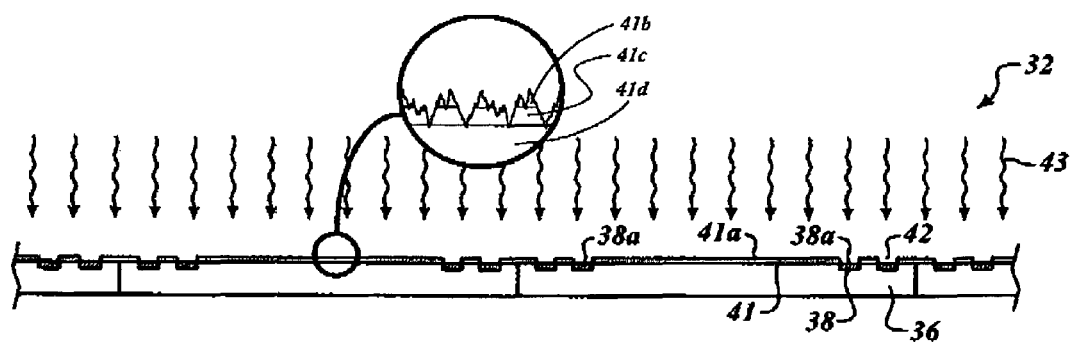

FIGS. 10A-10C show a portion of the semiconductor wafer 32 at various stages in the processing. An upper passivation layer 41 has been formed thereon in order to seal the wafer and provide electrical isolation. Each semiconductor die 36 includes a plurality of contact pads 38 for providing electrical contact between the integrated circuit components on the die 36 and other circuits to be formed on printed circuit boards as part of a larger electronic system, such as a personal computer, cell phone, or the like. While four contact pads 38 are shown, for each die 36 a majority of semiconductor die will have in the range of 10 to 50 such contact pads 38, and they will be arranged in various patterns depending on the desired packaging technology and the circuits formed on the individual die 36.

The passivation layer 41 is preferably composed of a plurality of separate layers and may have two or more sublayers in addition. For example, in one embodiment the passivation layer 41 includes a silicon nitride layer on top of which is formed a silicon carbide layer. In other embodiments, a first layer of silicon dioxide is overlaid directly on the top surface of the die 36, on top of which is formed a series of oxynitride layers and sublayers, on top of which is formed a dense silicon nitride layer. The uppermost passivation layer can be a silicon dioxide, a silicon nitride, a silicon carbide, or any other acceptable layer of a type currently used today.

As shown in FIG. 10B, after the passivation layer 41 is fully formed, the passivation layer is patterned and etched to open apertures 42 to expose the contact pads 38. The pattern and etching may be done using standard semiconductor processing, such as a photoresist followed by exposure to a desired pattern, development of the photoresist, and then etching. Other acceptable techniques for opening the contact pads 38 by the removal of selected regions of the passivation layer 41 are acceptable. Since the contact pads 38 are relatively large as compared to other features, the creation of the openings 42 can be done in a different front end and using different process technology than was used to manufacture the semiconductor die 36.

After the passivation layer 41 has been etched to provide openings 42, the semiconductor wafer 32 is exposed to an ionization gas to roughen up the top surface 41a. The ionized gas 43 may be of the type described with respect to the prior embodiment with respect to FIG. 4, and the details there need not be repeated here. Many ionization gases and etches can be used for step 28 depending on the uppermost layer of the passivation layer 41. For example, a standard reactive ion etch of the type which etches silicon nitride may be used when silicon nitride is the uppermost exposed layer. The etch 43 is carried out as a blanket etch, without a mask or any covering. Preferably, the etch 43 is generally an anisotropic etch with some unevenness which forms vertically oriented jagged peaks and valleys in the upper surface 41a to significantly roughen up the surface.

If the ionized gas 43 is an etch chemistry of the type normally used to etch the uppermost layer, such as a reactive ion etch for silicon nitride when silicon nitride is the uppermost exposed layer, then the time of exposure is kept very brief, since the desire is to only roughen up the surface and remove only portions of the top surface but not to completely remove the layer. For example, the time for the exposure may be in the range of 3-5 seconds if the ionization gas is an etch chemistry of the type which normally attacks silicon nitride, for example, a $CHF_3$ type etch in an argon gas. Alternatively, the ionized gas may be $CF_4$ in hydrogen, or $SF_6$. Similarly, if the uppermost layer is an oxynitride or a silicon dioxide, then a chemistry is selected for the ionization gas 43 which will substantially pit the uppermost surface, but not remove it.

According to a preferred embodiment, the upper passivation layer is composed of a plurality of layers which are selectively etchable with respect to each other. For example, in a preferred embodiment, the lowest passivation layer 41d is relatively thick silicon dioxide, on top of which are one or more oxynitride layers 41c, on top of which is a silicon nitride layer 41b as shown in FIG. 10C. The particular ionization gas 43 that is selected is one that will substantially roughen the nitride layer 41b, only slightly roughen the oxynitride layer 41c, and has a very low removal rate of the silicon dioxide layer 41d. Accordingly, if the wafer 32 is left too long in the reaction chamber 30 as shown in FIG. 4, a substantial portion of the uppermost layer, in this case silicon nitrate, may be removed with some partial removal of some portions of the oxynitride layer. Since the ionization gas 43 used is not effective to etch the silicon dioxide, a substantial portion of the passivation layer remains intact so that the semiconductor die 36 will remain protected and properly sealed by the passivation layer. Similarly, the uppermost layer may be a silicon dioxide and directly below it a silicon carbide which is relatively hard, or a silicon nitride. These layers are substantially resistant to the selected gas 43 to which the uppermost silicon dioxide layer is exposed. Accordingly, the roughening of the uppermost silicon dioxide layer, even if carried out for an extended period of time, is assured of not damaging the layers below it that make up the rest of the passivation layer 41 and the uppermost layers of the integrated circuit as contained on die 36. Therefore, having a plurality of layers in the passivation layer 41 which are selectively etchable with respect to each other, provides significant advantages according to the present invention to permit an uppermost layer to be substantially roughened with a high degree of roughness while ensuring that the main passivation layer is not damaged and affected by the gas ionization process.

In one preferred embodiment, the sequence of layers includes three separate layers which are progressively more etchable with respect to the particular ion gas used for the etching process. For example, as previously described, an uppermost layer of silicon nitride under which is a silicon carbide or an oxynitride, under which is a silicon dioxide. The etch chemistry selected is one to which the silicon nitride is very reactive and can be most easily etched, and the next underlying layer, such as an oxynitride or a silicon carbide, can be somewhat etched but not easily, and to which the bottommost layer is largely etch resistant.

During the exposure of the semiconductor die 36 to the ionization gas 43 shown in FIG. 10c, the contact pads 38 are also exposed to the same ionization gas. In some embodiments, the ionization gas 43 for the passivation layer 41 has no affect on the contact pads 38. An etch chemistry is selected that has little to no effect on the metal pads 28 while roughing up the surface 41a.

In an alternative embodiment, the etching chemistry of gas 43 is selected to also slightly etch or rough up a top most surface 38a of the contact pads 38. This provides the additional benefit that the top surface 38a of metal pads 38 are also somewhat roughened up by the ionization gas 43. In the event a reactive ion etch is used, care is taken to ensure that the etch chemistry is not sufficient to substantially etch away portions of the top 38a of the metal portions 38. While it is acceptable to roughen up the uppermost surface 38a of the contact pads 38, an ionization gas 43 must be selected in which the exposed metal surface 38 is left largely intact. In some embodiments, the uppermost metal surface 38a will be aluminum, while in other embodiments it is a nickel layer overlying aluminum. In some embodiments, the uppermost layer is the top metal layer of the integrated circuit, which may be a copper layer composed of a highly conductive copper alloy or an aluminum copper alloy composed of approximately 97% aluminum and 1%-2% copper, with some small percentage of silicon. In one embodiment, the contact pad 38 is a trilayer having a bottommost copper or aluminum layer, on top of which is a thin layer of nickel, on top of which is a thin layer of gold. Since the uppermost layer 38a will be electrically connected to a printed circuit board as described later herein, the uppermost surface is selected to provide a low resistance connection to the contact metallization to be used, which might be a copper pillar, a lead-free solder, a standard solder, or other acceptable metallization techniques.

After the blanket exposure of the wafer 32 to the ionization gas 43, both the upper surface 41a of the passivation layer and the uppermost exposed surface 38a of the contact pad 38 have been somewhat roughened up, though in differing amounts. The wafer is then singulated using standard techniques by sawing the individual die along the scribe lines as is known in the art.

Figure 11A:
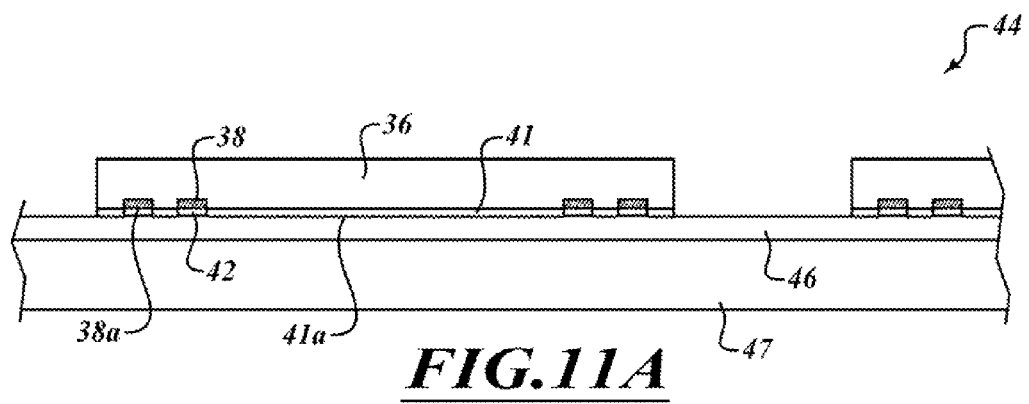
FIGS. 11A-11C are side views of the semiconductor chips at a later stage in the process.

As shown in FIG. 11A, each individual die 36 is then placed with a top face down on double-sided tape 46 which is supported by a carrier 47. The double-sided tape 46 directly abuts and contacts the roughened surface 41a of the passivation layer 41. The passivation layer 41 extends some distance above the contact pads 38, therefore an open space 42 is left in which the metal contact pad 38 does not directly abut the double-sided tape 46.

With the highly roughened surface 41a of the passivation layer, the individual die 36 have great adhesion to the double-sided tape 46 and are retained through later steps without having to apply excessive pressure. In some prior art techniques, one method that was attempted to overcome the problem of flying die was to press the semiconductor die with a large amount of force into the double-sided tape 46. This has the potential to cause damage to the die, and may crack one or more of the low-k dielectric layers which are used to make the integrated circuits as found on the semiconductor die 36. In addition, it may cause the double-sided tape 46 to abut against the metal contacts 38, which may leave an undesirable residue thereon or create other issues with later electrical connections. The use of the roughened surface in order to adhere the double sided tape 46 provides a significant benefit in providing very high adhesion to the double-sided tape 46 even when very low pressure is applied to press the individual die 36 onto the double-sided tape 46 as supported by carrier 47.

Figure 11B:
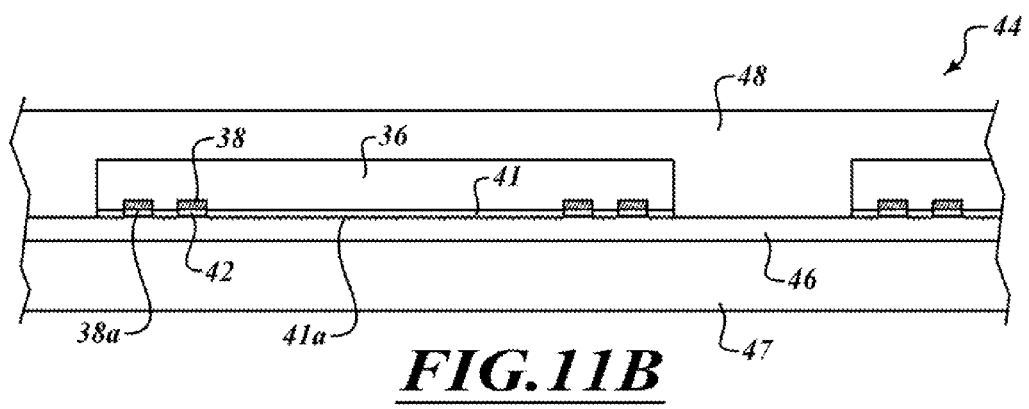
Figure 11C:
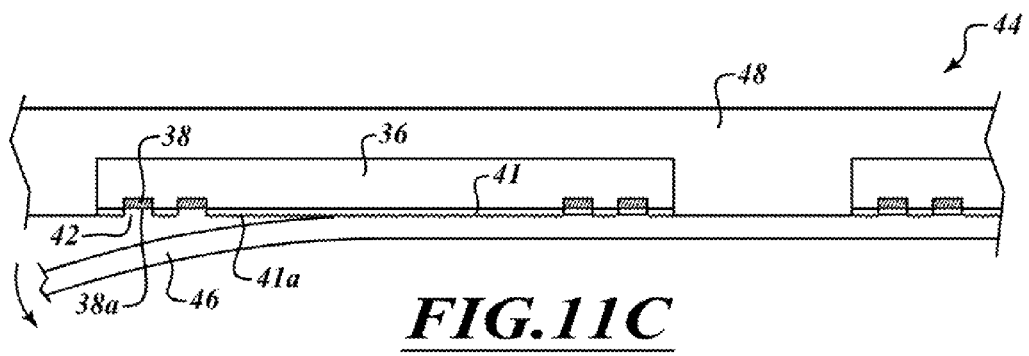

As shown in FIG. 11B, an encapsulation layer 48 is then flowed around the individual dies 36 as previously shown and described with respect to FIG. 6B.

Subsequently, the carrier 47 is removed and the double-sided tape 46 is removed from the surface of the die, leaving the encapsulated die 36 within the molding compound 48 and exposing the roughened surface 41a as well as openings 41 to the contact pads 38.

The contact pads 38 are now exposed and open, as is the roughened surface 41a of the passivation layer 41. Subsequently, the uppermost surface can be cleaned with an acceptable solvent to ensure that all residue of the double-sided tape 46 has been removed, particularly in the event some accidently came in contact with the contact pads 38. There are many known solvents for ensuring that the double-sided tape 46 is fully removed as previously described herein and as is known in the art.

Figure 12:
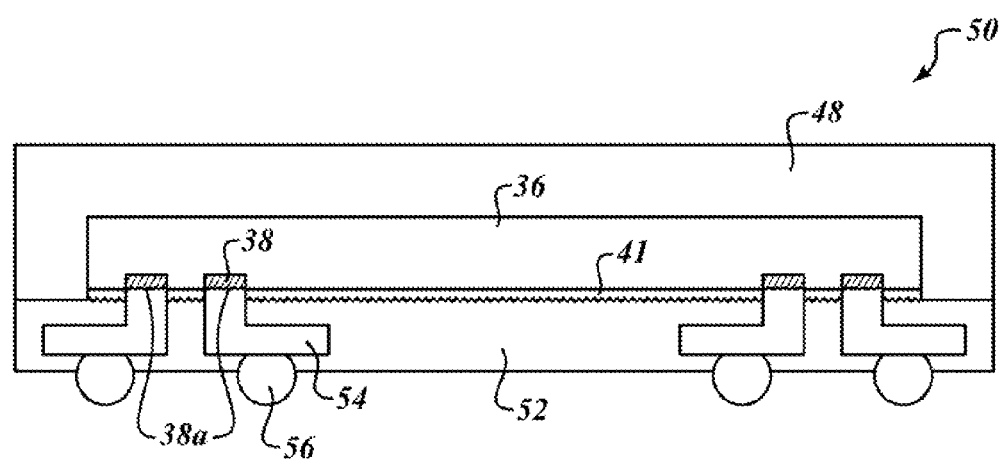
FIG. 12 is a completed, packaged, semiconductor chip according to a further embodiment.

FIG. 12 shows the subsequent steps that have been carried out to complete the packaging of the semiconductor die 36.

The formation of redistribution layers 52 having various electrically conductive paths therein are well known in the art. As shown in FIG. 12, various conductive metal contacts 54 are applied to the contact pads 38 in order to provide electrical connection thereto. One or more redistribution layers 52 are formed thereover to provide electrical isolation between the various interconnection layers 54 and the individual solder balls 56 to be later attached thereto.

According to the alternative embodiment as described herein, the uppermost surface of the passivation layer is not subject to a later polishing, grinding, or other treatment as previously described with respect to FIGS. 6C and 6D. Namely, after the double-sided tape 46 is removed, the individual die 36 have the roughened surface 41a exposed along with the uppermost, slightly roughened surface of contact pads 38. A redistribution layer 52 is formed directly on the roughened passivation layer 41a without additional polishing, grinding, CMP polishing, or the like. Accordingly, when the redistribution layer 52 comes in contact with the upper surface 41a, it adheres more strongly than if the upper surface had been polished. Having the roughened surface exposed provides some increase in the adhesion between the passivation layer 41a and the first part of the redistribution layer 52.

A further benefit is that the conductive contact layer 54 adheres more strongly, with lower resistivity, to the contact pads 38. The slight roughening of the contact pads 38 substantially increases the exposed surface area of the contact pads. This roughening may, in some instances, increase the exposed surface area by up to 50% or, in some cases, may double the exposed surface area. In the case where the conductive layer 54 is composed of a solder paste or flowable solder, the solder completely fills the cracks, crevices, gaps and other uneven portions of the contact layer 38, providing lower resistivity connection than is possible without the roughened surface. In addition, the solder more tightly bonds with the contact pad 38, and in addition to having an enlarged surface area with corresponding lower resistivity between the two, also has greater mechanical strength and better bonding than would be provided on a smooth upper surface for the contact pad 38.

The electrical interconnection layers 54 as shown in FIG. 12 are in a simplified, schematic form, as will be appreciated by those of skill in the art. In some embodiments, the layers 54 may be copper pillars on top of which a printed circuit board is applied having solder balls thereon in the standard flip-chip arrangement. Alternatively, layers 54 may include a small drop of solder or solder paste which first comes in contact with the contact pad 38, followed by subsequent electrical traces, interconnection lines, and the buildup of alternating electrically insulating redistribution layers, conductive layers, and the like. Thus, while layer 52 of FIG. 12 and layer 40 of FIG. 7 are shown schematically as a single layer, in practice they will be composed of many sublayers, with alternating electrically conductive traces and dielectric layers, as is well known in the art.

The various redistribution layers 52 and electrical interconnection layers are formed on the reconstituted wafer. The methods of forming reconstituted wafers and distribution layers thereon, with electrical conductors, is well known in the art and described in the following published and pending patent applications Ser. Nos. 12/982,707, 13/098,083, 13/173,991, and 12/977,697. After the packages are fully formed, the reconstituted wafer is cut to singulate the fully packaged die 36 as shown in FIGS. 12 and 7.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
forming a plurality of integrated circuits on a semiconductor wafer, each integrated circuit having a plurality of contact pads on an upper surface;
forming a passivation structure overlying the upper surface of the wafer, the passivation structure including a first dielectric layer on the upper surface of the wafer, a second dielectric layer on the first dielectric layer, the first dielectric layer having a first etch rate and the second dielectric layer having a second etch rate that is different from the first etch rate;
etching a pattern into the passivation structure to expose the contact pads of the plurality of integrated circuits, portions of the passivation structure remaining on the upper surface of the wafer;
forming a rough upper surface of the passivation structure by first removing portions of the second dielectric layer and then removing more portions of the second dielectric layer while also removing portions of the first dielectric layer with an ionized gas, remaining portions of the passivation structure including high points that include the second dielectric layer and low points that include the first dielectric layer; and
cutting the semiconductor wafer into a plurality of semiconductor die.

2. The method of claim 1, wherein the ionized gas is produced in an ionization chamber.

3. The method of claim 1, wherein the ionized gas is any one of oxygen and tetrafluoride gases.

4. The method of claim 1, wherein the passivation structure includes any one of silicon nitride, silicon dioxide, and oxynitride.

5. The method of claim 1, further comprising:
affixing the plurality of semiconductor dies to an adhesion layer for forming a packaged semiconductor device, the remaining portions of the passivation layer being in contact with the adhesion layer; and
forming an encapsulation layer enclosing the adhesion layer and the plurality of semiconductor dies affixed to the adhesion layer.

6. The method of claim 1, wherein the ionized gas is produced using plasma etching.

7. The method of claim 6, wherein the plasma etching is one of reactive-ion etching and inductive coupled plasma etching.

8. The method of claim 5, wherein the adhesion layer comprises adhesive tape.

9. A device, comprising:
a die having a plurality of contact pads exposed through a first surface of the die;
a passivation structure on the first surface of the die, the passivation structure including:
a first dielectric layer on the first surface; and
a second dielectric layer on the first dielectric layer, the passivation structure includes high points and low points, the high points including the second dielectric layer and the low points extending into the first dielectric layer;
an encapsulation layer formed on a second surface of the die and on sides of the die;
a redistribution layer including a third dielectric layer in contact with the high points and low points of the passivation structure and the third dielectric layer in direct contact with the encapsulation layer; and
external contacts formed on the redistribution layer, the external contacts being physically separated from the contact pads by the redistribution layer and electrically coupled to the contact pads through the redistribution layer.

10. The device of claim 9 wherein the first dielectric layer includes silicon dioxide and the second dielectric layer includes silicon nitride.

11. The device of claim 9 wherein the first dielectric layer includes silicon carbide and the second dielectric layer includes silicon nitride.

12. A method, comprising:
forming a plurality of die on a semiconductor wafer, each die including integrated circuit having a plurality of contact pads exposed at an upper surface of the wafer;
forming a passivation structure overlying the upper surface of the wafer;
exposing the contact pads by etching a selected pattern into the passivation structure;
forming a rough surface on the passivation structure and the contact pads across the wafer by exposing the passivation structure and the contact pads to an ionized gas;
separating the wafer into the die after forming the rough surface, each die having the rough surface;
affixing the rough surface of each die to an adhesion layer;
forming an encapsulant on the die and on the adhesion layer;
removing the adhesion layer after forming the encapsulant;
forming a redistribution layer coupled to the contact pads of each die; and
separating the die into a plurality of semiconductor packages, each package including the die with the rough surface.

13. The method of claim 12 wherein forming the passivation structure includes forming a first dielectric layer on the upper surface of the wafer and forming a second dielectric layer on the first dielectric layer; and forming the rough surface includes forming high points that include the second dielectric layer and forming low points that expose portions of the first dielectric layer.

* * * * *